United States Patent [19]

Chnapko et al.

[11] 4,146,835
[45] Mar. 27, 1979

[54] TESTING THE DIFFERENTIAL RESPONSE TIMES OF A PLURALITY OF CIRCUITS

[75] Inventors: Joseph R. Chnapko, Emmaus; Richard S. Lewis, Bethlehem; Livio R. Melatti, Northampton County, all of Pa.; Melville R. Smart, Greensboro, N.C.

[73] Assignee: Western Electric Co., Inc., New York, N.Y.

[21] Appl. No.: 884,451

[22] Filed: Mar. 8, 1978

[51] Int. Cl.² .......................................... G01R 15/12
[52] U.S. Cl. ............................ 324/73 R; 324/57 DE
[58] Field of Search .............. 324/73 R, 73 AT, 57 R, 324/57 DE

[56] References Cited

FOREIGN PATENT DOCUMENTS 1338241 11/1973 United Kingdom .............. 324/57 DE
505972 10/1976 U.S.S.R. ................................ 324/57 R Primary Examiner—Robert J. Corcoran
Attorney, Agent, or Firm—R. Y. Peters; G. W. Houseweart

[57] ABSTRACT

In integrated circuits having multiple gate functions, the difference between the propagation delay times of each of the gate functions is often important in that it affects the reliability of the circuits. To determine these delay differences, input signals are applied simultaneously to the multiple gate functions. The output signals of the gate functions are monitored, and a reference signal is generated at the time of sensing the first output signal. This reference signal is indicative of the fastest propagation delay time. A delay time equal to the maximum allowable differential delay time between the fastest propagation delay time and the slowest propagation delay time is added to the reference signal. The delayed reference signal is then compared with the gate function propagation delay time to determine if any of the gate function delays are longer. If any of the gate function delays are longer, this indicates that the delay of the particular gate function is greater than the fastest propagation delay time by an amount larger than the maximum allowable difference.

13 Claims, 3 Drawing Figures

TESTING THE DIFFERENTIAL RESPONSE TIMES OF A PLURALITY OF CIRCUITS

FIELD OF THE INVENTION

This invention relates to testing the differential response times of a plurality of circuits, and more particularly, to determining differential propagation delay times between multiple gate functions of an integrated circuit.

DESCRIPTION OF THE PRIOR ART

Transistor-transistor logic integrated circuits (TTL's) are often designed to have a plurality of gate functions arranged in parallel. Typically, these gate functions are symmetrical although this is not always the case.

Generally, testing of such integrated circuits for propagation delay is limited to comparing the individual gate functions against a standard reference delay. If all of the gate functions are less than the reference delay the integrated circuit passes the test.

Recently, it has been found that a number of units have a reduced product life and fail in operation even though all of the gate function propagation delays are within preset maximum limits. It has been determined that the reasons for such failures are point defects that exist in the inner part of the circuits. Such point defects are inaccessible for detection by standard time invariant (DC) parametric measurement techniques. However, it has also been found that such point defects arise in terms of creating excessive differences between the gate function having the fastest propagation delay time and the gate function having the slowest propagation delay time.

To discover such point defects, testing has been done to determine the differential propagation delay times. But the ways which are commercially available require sequentially sending a plurality of different input pulses through the gate functions to determine their individual propagation delay times. The delay times are then mathematically compared to determine the differential. These techniques have been found to be quite time consuming and expensive.

SUMMARY OF THE INVENTION

It is, therefore, an object of the present invention to provide new and improved methods of and apparatus for testing the differential response times of a plurality of circuits.

Another object of the present invention is to provide new and improved methods of and apparatus for determining the differential propagation delay times between multiple gate functions of an integrated circuit.

A further object of the present invention is to provide new and improved methods of and apparatus for determining the differential propagation delay times between multiple gate functions of an integrated circuit using only a single input signal at each of the gate functions.

With these and other objects in view, the present invention contemplates new methods of and apparatus for determining the differential response times of a plurality of circuits by applying input signals simultaneously to the circuits. The response times of the circuits are monitored and a reference signal is generated at the time at which the shortest response time is monitored. A delay time is added to this reference signal wherein the added delay time is equal to the maximum allowable time difference between the shortest and the longest response time. The response times of each of the circuits is then compared with the delayed reference signal. An indication is then given if any of the circuits have a response time greater than the delayed reference signal.

BRIEF DESCRIPTION OF THE DRAWING

Other objects and advantages of the present invention may be more clearly understood by reference to the following detailed description and drawing wherein.

DETAILED DESCRIPTION OF THE INVENTION

Determining Differential Propagation Delay Time

Figure 1:
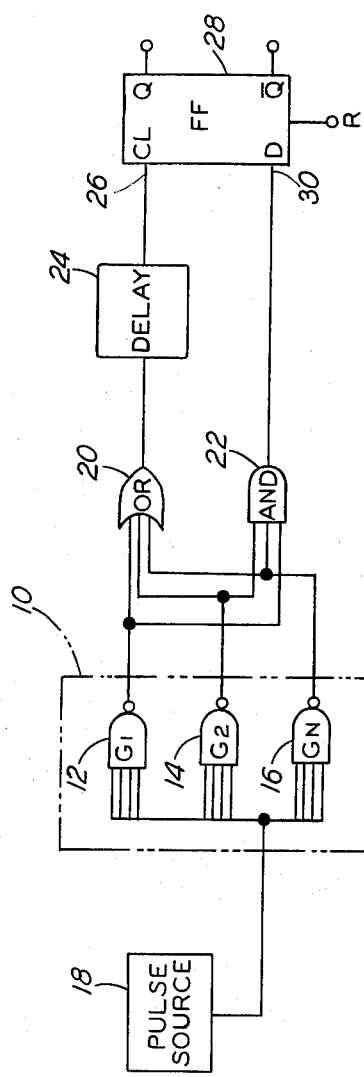
FIG. 1 is a partial schematic and partial block diagram of a first embodiment of the present invention for determining the differential delay time between the fastest propagation delay time and the slowest propagation delay time.

Referring now to the drawing and in particular to FIG. 1, an integrated circuit 10 having a plurality of gates 12, 14 and 16 is shown coupled to a pulse source 18. The pulse source 18 provides input pulses simultaneously to each of the gates 12, 14 and 16. Typically, the pulse source 18 is a conventional clock circuit or a monostable multivibrator.

The outputs of each of the gates 12, 14 and 16 are coupled to both an OR circuit 20 and an AND circuit 22. The OR circuit monitors the output pulses of all of the gates 12, 14 and 16 and changes states thereby generating a reference signal when it receives the first output pulse from one of the gates 12, 14 or 16. The AND circuit also monitors the output pulses of the gates 12, 14 and 16 and does not change states until all of the output pulses from the gates 12, 14 and 16 are received. The reference signal from the OR gate is indicative of the fastest propagation delay time of the gate functions while the output of the AND gate is indicative of the slowest propagation delay time.

To determine whether the difference between the fastest propagation delay time and the slowest propagation delay time is excessive, a delay circuit 24 is coupled to the output of the OR circuit 20. The delay circuit 24 is set to the maximum allowable difference in time between the fastest propagation delay and the slowest propagation delay. The output of the delay circuit 24 is coupled to the CL terminal 26 of a type D flip-flop 28. The output of the AND circuit 22 is coupled to the D terminal 30 of the flip-flop 28.

The flip-flop 28 operates in the manner conventional to a type D flip-flop in that it changes states only if the CL terminal 26 receives a signal before the D terminal 30. In the circuit shown in FIG. 1 this would occur if the delayed signal from the delay circuit 24 arrived at the CL terminal 26 before the signal from the AND circuit 22. This indicates that the slowest propagation delay time is greater than the maximum allowable delay differential indicated by the delay circuit 24. Thus, the flip-flop 28 would change states to indicate that the integrated circuit 10 was to be disqualified. After testing, the flip-flop 28 is reset to its original state. This is done by providing a pulse to the R terminal of the flip-flop 28 via any form of conventional control circuit (not shown).

Circuit for Determining the Difference Between Individual Gates

Figure 2:
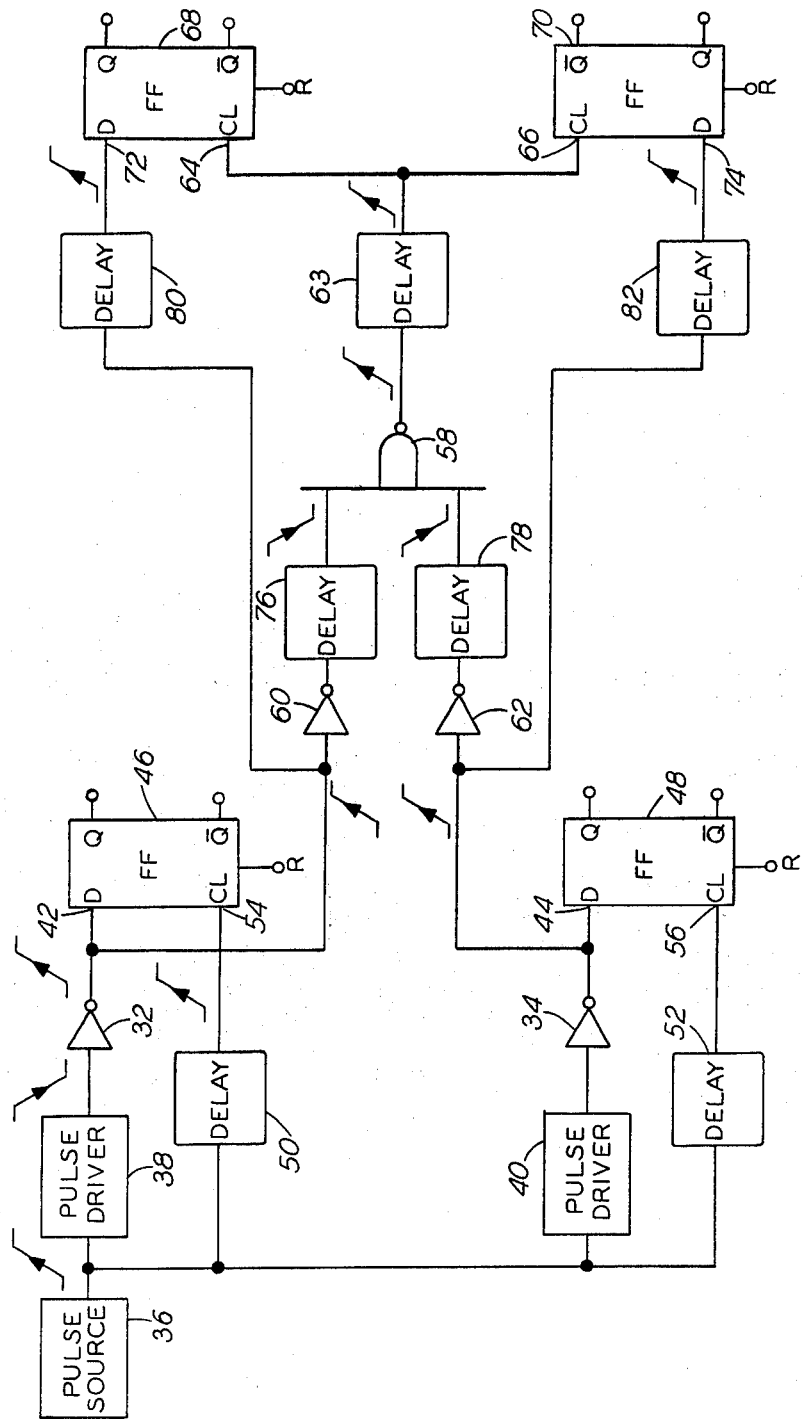
FIG. 2 is a partial schematic and partial block diagram showing an alternative embodiment capable of indicating which particular gates have excessive differential propagation delay times.

Referring now to FIG. 2, a circuit is shown for determining the difference in propagation delay between the gate having the fastest propagation delay and each of the other individual gates. This allows pinpointing the particular gate or gates which are out of specification. In addition the circuit shown in FIG. 2 also provides for separately testing each gate against a reference propagation delay between gates.

The gates under test 32 and 34 are coupled to a pulse source 36 via pulse drivers 38 and 40, respectively. These pulse drivers 38 and 40 are conventional pulse shaping circuits which shape the pulse output of the pulse source 36 to the particular form best suited for input into the gates 32 and 34. Generally, the pulse drivers 38 and 40 will be made with logic circuits when used in testing logic gates.

Figure 3:
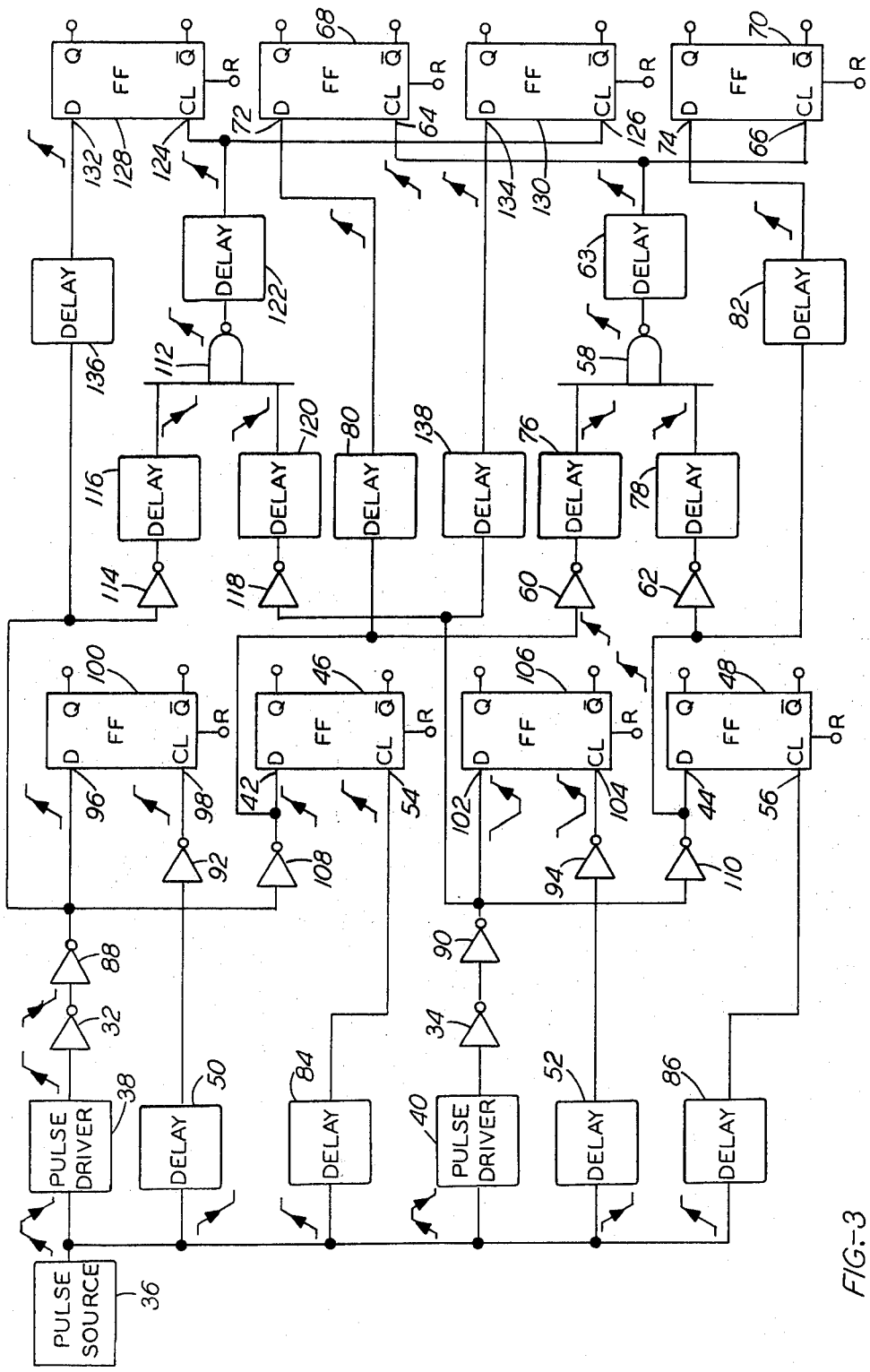
FIG. 3 is a partial schematic and partial block diagram showing another alternative embodiment capable of simultaneously testing the differential propagation delay time of the gate functions in going from their low to high state and their high to low state.

In FIGS. 2 and 3 the pulse drivers 38 and 40 include an inverter stage to convert the low to high signal from the pulse source 36 (i.e., the change of the pulse source from a "0" state to a "1" state) into a high to low signal at the inputs of gates 32 and 34. Since the gates 32 and 34 are themselves inverters, they in turn give output low to high signals. These low to high signals from the gates 32 and 34 are then applied to the D terminals 42 and 44 of flip-flop circuits 46 and 48, respectively.

Simultaneous to the application of a signal from the pulse source 36 to the pulse drivers 38 and 40, signals from pulse source 36 are also applied to reference delay lines 50 and 52. These reference delay lines 50 and 52 establish the maximum propagation delay allowable for any individual gate. The delayed signals from the reference delay lines 50 and 52 are applied to the CL terminals 54 and 56 of the flip-flops 46 and 48, respectively. If the reference delay lines 50 and 52 activate the CL terminals 54 and 56 prior to the arrival of the output pulses of the gates 32 and 34 at their respective D terminals 42 and 44, the flip-flops 46 or 48 will change states. This indicates that the gate coupled to the particular flip-flop has a propagation delay time which is too long.

The low to high output signals of the gates 32 and 34 are monitored by a NAND gate 58 via inverters 60 and 62, respectively. The signals appearing at the input of the NAND gate 58 are high to low signals due to the inverters 60 and 62.

The NAND gate 58 gives an output low to high signal when it receives the first high to low signal at its input. This output signal thus is indicative of the fastest propagation delay among the gates 32 and 34. The low to high output signal passes through a delay line 63 which is set to the maximum allowable difference between the fastest propagation delay time and the slowest propagation delay time. The output of the delay line 63 is in turn coupled to the CL terminals 64 and 66 of flip-flops 68 and 70.

The low to high output signals of the gates 32 and 34 are coupled to the D terminals 72 and 74 of the flip-flop 68 and 70, respectively. If the output from the delay line 63 arrives at the CL terminal 64 of the flip-flop 68 before the signal from the gate 32 arrives at the D terminal 68, the gate 32 is found to have too slow a propagation delay time. Similarly, gate 34 is disqualified if the output signal from it arrives at the D terminal 74 of the flip-flop 70 after the output signal from the delay line 63 has arrived at the CL terminal 66.

Although the circuit of FIG. 2 has been shown in conjunction with testing a inverting logic circuit, it is to be understood that non-inverting logic gates could be tested as well. Similarly, the propagation delay of gates in going from the high state to the low state could be tested rather than the low to high propagation by the particular arrangement of inverters. Also, any number of gates could be tested simultaneously rather than just two as shown.

Under present manufacturing specifications, typical circuit requirements for propagation delay times are a maximum of 40 nanoseconds of propagation delay time through any individual gate and a differential propagation delay time between the fastest and the slowest gates of no more than 10 nanoseconds. In order to adjust the circuit shown in FIG. 2 to allow testing of such short intervals of time, calibration delay lines 76, 78, 80 and 82 are provided. The delay lines 76 and 78 are placed between the inverters 60 and 62 and the NAND gate 58. The calibration delay lines 80 and 82 are placed respectively between the outputs of the gates 32 and 34 and the D terminals 72 and 74 of flip-flops 68 and 70.

Single Pulse Test for Testing Differential Propagation Delay in Gate Functions Going from a Low to High State and a High to Low State Referring now to FIG. 3, a circuit is shown for determining propagation delay and differential propagation delay of a plurality of gates in going from low to high states and the high to low states with a single pulse input to each gate.

In FIG. 3 numerals which are identical to those in FIG. 2 serve the same function as they did in FIG. 2. Specifically, this function is to indicate whether the gates 32 and 34 fall within a predetermined maximum propagation delay and differential propagation delay in passing from a low state to a high state as previously described.

To perform the additional function of testing the high state to the low state propagation delay of gates 32 and 34, pulses from the pulse source 36 are applied to the reference delay lines 84 and 86 simultaneously with the application of pulses to the drivers 38 and 40 and the reference delay lines 50 and 52. These delay lines 84 and 86 are set at the maximum allowable propagation delay for the gates 32 and 34 going from a high state to a low state. Inverters 88, 90, 92 and 94 are provided at the outputs of gates 32, 34 and delay lines 50 and 52, respectively. These inverters 88 through 94 invert high to low outputs to give a low to high output.

The outputs of inverters 88 and 92 are applied respectively to the D terminal 96 and CL terminal 98 of a flip-flop 100. Similarly, the outputs of inverters 90 and 94 are respectively applied to the D terminal 102 and CL terminal 104 of a flip-flop 106. If either of the CL terminals 98 or 104 are activated by their respective inverters 92 or 94 before the D terminals 96 and 102 are activated, the propagation delay through either gate 32 or 34 in going from their high state to their low state is too long. This is indicated by flip-flop 100 or 106 changing states.

Additional inverters 108 and 110 are provided in the circuits shown in FIG. 3 to couple the inverters 88 and 90 respectively to the D terminals 42 and 44 of flip-flops 46 and 48. This is done so that the D terminals 42 and 44 receive a low to high state change.

To test for the differential propagation delay time between gates 32 and 34 in changing from the high state to the low state, a second NAND gate 112 is provided. This NAND gate 112 is coupled to the output of the inverter 88 by an inverter 114 and a calibration delay line 116. The NAND gate 112 is also coupled to the output of the inverter 90 by the inverter 118 and a calibration delay line 120. Thus, through the action of the various inverters the inputs to the NAND gate 112 will be a signal going from a high state to a low state corresponding to the change of state from high to low of the gates 32 and 34.

The output of the NAND gate 112 will be a low to high signal indicative of the fastest propagation delay time of one of the gates 32 or 34 in going from the high to the low state. This output signal from 112 indicative of the fastest propagation delay time is in turn passed through a delay line 122. Delay line 122 is set to be the maximum allowable difference in time between the fastest propagation delay time and the slowest propagation delay time.

The output of the delay line 122 is applied to the CL terminals 124 and 126 of flip-flops 128 and 130, respectively. The D terminals 132 and 134 of the flip-flops 128 and 130 are respectively coupled to the outputs of inverters 88 and 90. Calibration delay lines 136 and 138 are provided in the coupling between the inverters 88 and 90 and the D terminals 132 and 134.

The input signals to the flip-flops 128 and 130 are low to high signals corresponding to the high to low outputs of gates 32 and 34. If the delayed fastest propagation delay signal from delay line 122 activates the CL terminals 124 or 126 before the D terminals 132 or 134 are activated, the differential propagation delay time between the gates 32 and 34 is too great. Correspondingly, the flip flop 128 or 130 associated with the slower gate 32 or 34 changes states giving an indication of which gate is too slow.

Although the description has related primarily to testing the differential propagation delay of multiple gate functions, it should be understood that the invention could be used to test other response times of other circuits. For example, the invention could be used to test the rise and fall response times of a wide variety of circuits. In such a case the circuit operates to determine the difference between the shortest and longest response times.

Although the circuitry described in FIGS. 2 and 3 has related to the use of a NAND gate and various inverters, it is to be understood that other conventional logic circuitry could be used to perform these same functions.

Furthermore, it should be noted that all of the logic gates, delay lines, flip-flops, inverters, pulse sources and pulse drivers described are of conventional design and can be readily chosen from commercially available models to suit the particular specification requirements of the logic gates under test. After each test all of the flip-flops are reset to their original states by a pulse to their reset terminals R. This pulse is provided by any type of conventional control circuit for this purpose.

It is to be understood that the above-described arrangements are simply illustrative of the application of the principles of this invention. Numerous other arrangements may be readily devised by those skilled in the art which embody the principles of the invention and fall within its scope and spirit.

What is claimed is:

1. A method of testing the differential response times of a plurality of circuits comprising:
    applying input signals simultaneously to the circuits;
    monitoring the response times of the circuits;
    generating a reference signal at the time of monitoring the shortest response time;
    delaying the reference signal by a time equal to the maximum allowable time difference between the circuit with the shortest response time and the circuit with the longest response time;
    comparing the response times of each of circuits with the delayed reference signal; and
    indicating whether any of the circuits has a response time longer than the delayed reference signal.

2. A method of testing the differential propagation delay time of a plurality of circuits each of which gives an output signal in response to an input signal after a propagation delay time, the method comprising:
    applying input signals simultaneously to the circuits;
    monitoring the output signals of the circuits;
    generating a reference signal at the time of monitoring the first output signal, said reference signal thereby indicating the fastest propagation delay time of the circuits;
    delaying the reference signal by a time equal to the maximum allowable time difference between the circuit with the fastest propagation delay time and the circuit with the slowest propagation delay time;
    comparing the propagation delay time of each of the circuits with the delayed reference signal; and
    indicating whether any of the circuits has a propagation delay time greater than the delayed reference signal.

3. The method of claim 2, wherein the circuits are multiple gate functions integrated on a single chip of semiconductor material, the method further comprising:
    generating the reference signal by passing the output signals of all the gate functions through an OR gate which generates the reference signal when it receives the first output signal;
    determining the slowest propagation delay of the gate functions by passing the output signals of all of the gate functions through an AND gate which gives an output signal when it receives all of the gate function output signals; and
    comparing the delayed reference signal of the OR gate and the output signal of the AND gate in a comparator circuit which changes states if the delayed reference signal of the OR gate arrives before the output signal of the AND gate.

4. The method of claim 2, wherein the circuits are multiple gate functions integrated on a single chip of semiconductor material, the method further comprising:
    generating the reference signal by passing all of the output signals of the gate functions to a NAND gate which generates the reference signal when it receives the first gate function output signal; and
    comparing each of the gate function output signals individually to the delayed reference signal of the NAND gate to determine which individual gate functions have a propagation delay time greater than the delayed reference signal.

5. The method of claim 2, wherein the circuits are multilple gate functions integrated on a single chip of semiconductor material and each of the gate functions has a low state and a high state, the method further comprising:
generating a first reference signal indicative of the fastest propagation delay time for the gate functions passing from a low state to a high state by coupling the outputs of the gate functions to a NAND gate which generates the first reference signal when it receives the first gate function output signal passing from a low state to a high state;
generating a second reference signal indicative of the fastest propagation delay time for the gate functions passing from a high state to a low state by coupling the outputs of the gate functions to a second NAND gate which generates the second reference signal when it receives the first gate function output signal passing from a high state to a low state;
delaying the first and second reference signals by a time equal to the maximum allowable time difference between the gate functions with the fastest propagation delay time and the slowest propagation delay time;
comparing each of the individual gate function output signals with the delayed first reference signal of the first NAND gate to determine which gate functions have a propagation delay time for passing from the low state to the high state greater than the delayed first reference signal; and
comparing each of the individual gate function output signals with the delayed second reference signal of the NAND gate to determine which gate functions have a propagation delay time for passing from the high state to the low state greater than the delayed second reference signal.

6. The method of claim 2, further comprising:
comparing the propagation delay times of each of the circuits individually to a reference propagation delay time prior to comparing the circuits to the delayed reference signal; and
identifying if any of the circuits have a propagation delay time which exceeds the reference maximum propagation delay time.

7. An apparatus for testing the differential response time of a plurality of circuits, the apparatus comprising:
means for applying input signals simultaneously to the circuits;
means for monitoring the response times of the circuits;
means for generating a reference signal at the time of monitoring the shortest response time;
means for adding a delay time to the reference signal equal to the maximum allowable time difference between the circuit with the shortest response time and the circuit with the longest response time;
means for comparing the response times of each of the circuits with the delayed reference signal; and
means for indicating whether any of the circuits has a response time longer than the delayed reference signal.

8. An apparatus for testing the differential propagation delay time of a plurality of circuits each of which gives an output signal in response to an input signal after a propagation delay time, the apparatus comprising:
means for applying input signals simultaneously to the circuits;
means for monitoring the output signals of the circuits;
means for generating a reference signal at the time of monitoring the first output signal, said reference signal thereby indicating the fastest propagation delay time of the circuits;
means for adding a delay time to the reference signal equal to the maximum allowable time difference between the circuit with the fastest propagation delay time and the circuit with the slowest propagation delay time;
means for comparing the propagation delay times of each of the circuits with the delayed reference signal; and
means for indicating whether any of the circuits has a propagation delay time greater than the delayed reference signal.

9. The apparatus of claim 8, wherein the circuits are multiple gate functions integrated on a single chip of semiconductor material, the apparatus further comprising:
an OR gate coupled to the output signals of each of the gate functions to generate the reference signal when it receives the first gate function output signal thereby establishing the fastest propagation delay time;
an AND gate coupled to the output signals of each of the gate functions to give an output signal only when it receives all of the gate function output signals, thereby establishing the slowest propagation delay time; and
means for comparing the delayed reference signal of the OR gate and the output signal of the AND gate.

10. The apparatus of claim 9, wherein the comparing means is a bistable circuit which will only change states if the delayed reference signal of the OR gate arrives before the output signal of the AND gate.

11. The apparatus of claim 8, wherein the circuits are multiple gate functions integrated on a single chip of semiconductor material, the apparatus further comprising:
a NAND gate coupled to the output signals of the gate functions to generate the reference signal when it receives the first gate function output signal thereby determining the fastest propagation delay time; and
means for comparing each of the gate function output signals individually to the delayed reference signal of the NAND gate to determine which individual gate functions have a propagation delay time greater than the delayed reference signal.

12. The apparatus of claim 8, wherein the circuits are multiple gate functions integrated on a single chip of semiconductor material and each of the gate functions has a low state and a high state, the apparatus further comprising:
a first NAND gate coupled to the output signals of the gate functions to generate a first reference signal when it receives the first gate function output signal passing from a low state to a high state thereby determining the fastest propagation delay time of the gate functions for passing from a low state to a high state;
a second NAND gate coupled to the output signals of the gate functions to generate a second reference signal when it receives the first gate function output signal passing from a high state to a low state thereby determining the fastest propagation delay time of the gate functions for passing from a high state to a low state;

means for adding a delay time to the first and second reference signals equal to the maximum allowable time difference between the circuits with the fastest propagation delay time and the shortest propagation delay time;

means for comparing each of the individual gate function output signals with the delayed first reference signal of the first NAND gate to determine which gate functions have a propagation delay time for passing from the low state to the high state greater than the delayed first reference signal; and means for comparing each of the individual gate function output signals with the delayed second reference signal of the second NAND gate to determine which gate functions have a propagation delay time for passing from the high state to the low state greater than the delayed second reference signal.

13. The apparatus of claim 8, further comprising:

means for comparing the propagation delay times of each of the circuits individually to a reference maximum propagation delay time prior to comparing the circuits to the delayed reference signal; and means for indicating whether any of the circuits has a propagation delay time greater than the reference maximum propagation delay time.

* * * * *

UNITED STATES PATENT AND TRADEMARK OFFICE
CERTIFICATE OF CORRECTION

PATENT NO. : 4,146,835
DATED : March 27, 1979
INVENTOR(S) : Joseph R. Chnapko, Richard S. Lewis, Livio R. Melatti and Melville R. Smart It is certified that error appears in the above-identified patent and that said Letters Patent are hereby corrected as shown below:

Column 7, claim 5, line 36, before "NAND", --second-- was omitted.

Column 7, claim 6, line 42, before "propagation", --maximum-- was omitted.

Signed and Sealed this

Twenty-fifth Day of September 1979

[SEAL]

Attest:

LUTRELLE F. PARKER

Attesting Officer     Acting Commissioner of Patents and Trademarks